United States Patent
Kwok et al.

(10) Patent No.: US 8,426,865 B2
(45) Date of Patent: Apr. 23, 2013

(54) POLYCRYSTALLINE SILICON THIN FILM TRANSISTORS WITH BRIDGED-GRAIN STRUCTURES

(75) Inventors: Hoi Sing Kwok, Hong Kong (CN); Man Wong, Hong Kong (CN); Zhiguo Meng, Hong Kong (CN); Shuyun Zhao, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 137 days.

(21) Appl. No.: 12/666,220

(22) PCT Filed: Feb. 4, 2008

(86) PCT No.: PCT/CN2008/000313
§ 371 (c)(1),
(2), (4) Date: Dec. 22, 2009

(87) PCT Pub. No.: WO2009/000136
PCT Pub. Date: Dec. 31, 2008

(65) Prior Publication Data
US 2010/0171546 A1    Jul. 8, 2010

Related U.S. Application Data

(60) Provisional application No. 60/929,338, filed on Jun. 22, 2007.

(51) Int. Cl.
*H01L 27/108* (2006.01)
(52) U.S. Cl.
USPC .................... 257/67; 257/72; 257/347

(58) Field of Classification Search ............. 257/67, 257/72, 347, E29.293; 438/316, 142
See application file for complete search history.

(56) References Cited

U.S. PATENT DOCUMENTS

| | | | |
|---|---|---|---|
| 5,329,138 A | 7/1994 | Mitani et al. | |
| 5,780,899 A * | 7/1998 | Hu et al. | 257/335 |
| 6,225,197 B1 | 5/2001 | Maekawa | |
| 6,232,622 B1 | 5/2001 | Hamada | |
| 2005/0040402 A1 | 2/2005 | Ohtani et al. | |

FOREIGN PATENT DOCUMENTS

| | | | |
|---|---|---|---|
| JP | 57-083047 A | 5/1982 | |
| JP | 2001-244198 A | 5/1982 | |
| JP | 06-104438 A | 4/1994 | |
| JP | 2004-179195 A | 4/1994 | |
| JP | 2004-146809 | * 6/2004 | 438/143 |

OTHER PUBLICATIONS

Lee et al., "A novel poly-Si TFTs with selectively doped regions fabricated by new excimer laser annealing," Society for Information Display (SID), San Jose, USA, 1246-1249 (Jun. 2001).

(Continued)

*Primary Examiner* — Long Pham
*Assistant Examiner* — Steven Rao
(74) *Attorney, Agent, or Firm* — Leydig, Voit & Mayer, Ltd.

(57) ABSTRACT

A low temperature polycrystalline silicon device and techniques to manufacture thereof with excellent performance. Employing doped poly-Si lines which we called a bridged-grain structure (BG), the intrinsic or lightly doped channel is separated into multiple regions. A single gate covering the entire active channel including the doped lines is still used to control the current flow. Using this BG poly-Si as an active layer and making sure the TFT is designed so that the current flows perpendicularly to the parallel lines of grains, grain boundary effects can be reduced.

53 Claims, 8 Drawing Sheets

(a)

(b)

Schematic diagrams of the low temperature poly-Si film and the corresponding barrier potentials.

OTHER PUBLICATIONS

Lee et al., "High-performance poly-Si TFTs with multiple selectively doped regions in the active layer," Mat. Res. Soc. Sump. Proc., 621: Q9.11.1-Q9.11.6 (2000).

Meng et al., "Polycrystalline silicon films and thin-film transistors using solution0-based metal-induced crystallization," J. Display Technol., 2 (3): 265-273 (Sep. 2006).

Song et al., "A new multi-channel dual-gate poly-Si TFT employing excimer laser annealing recrystallization on pre-patterned a-Si thin film," International Electron Devices Meeting (IEDM), 561-564 (San Francisco CA, USA, Dec. 8-11, 2002).

\* cited by examiner (a)

(b)

Figure 1: Schematic diagrams of the low temperature poly-Si film and the corresponding barrier potentials.

(a)

(b)

Figure 2: Schematic diagrams of the annealed ELC low temperature poly-Si film and the corresponding barrier potentials (a)

(b)

Figure 3: Schematic diagrams of lightly doped low temperature poly-Si film and the corresponding barrier potentials.

Figure 4: Schematic diagrams of the bridged-grain structure poly-Si film and the corresponding barrier potential distributions Figure 5 Cross-sectional diagram illustrating the formation of the poly-Si films deposited on the glass substrate.

Figure 6: The cross-sectional view illustrating two methods of producing the bridged-grain structure. (a) Ion implantation through a mask or photoresist (b) Direct focused ion beam scanning of the polycrystalline thin film.

Figure 7: Schematic cross-section illustrating the formation of the active island of a low temperature poly-Si thin film transistor.

Figure 8: The cross-sectional view illustrating formation of the gate insulator layer and the gate electrode of a low temperature poly-Si thin film transistor.

Figure 9: The schematic of the source and drain implantation of a low temperature poly-Si thin film transistor.

Figure 10: The cross-section view for the formation of metal electrode of a low temperature poly-Si thin film transistor.

Figure 11: The transfer Id-Vg curves and the field effect mobility ($\mu_{FE}$) of MIC low temperature poly-Si TFT with and without the bridged-grain structure. Great improvement in electrical properties is evident.

POLYCRYSTALLINE SILICON THIN FILM TRANSISTORS WITH BRIDGED-GRAIN STRUCTURES

CROSS-REFERENCE TO OTHER APPLICATION

Priority is claimed from U.S. provisional 60/929,338 which is hereby incorporated by reference.

BACKGROUND

The present application relates to methods and systems for forming high performance, high uniformity, and high reliability low temperature polycrystalline thin film devices on glass substrates.

The following paragraphs contain some discussion, which is illuminated by the innovations disclosed in this application, and any discussion of actual or proposed or possible approaches in these paragraphs does not imply that those approaches are prior art.

Display devices, such as used in television and computer screens, are rapidly evolving into high quality flat-panel displays employing active-matrix driving technology. The latest displays technologies, such as liquid-crystal displays (LCD), organic light-emitting diodes (OLED), and electronic ink, all benefit from active-matrix driving. Active-matrix driving allows the realization of full colors and high resolution with significantly reduced cross talk. An essential key technology of active-matrix driving display is the fabrication of thin-film transistors (TFT) on a flat substrate, which is usually glass.

In conventional active-matrix displays, the TFTs are formed using amorphous silicon (a-Si). This is due to its low processing temperature and low manufacturing cost on large-area glass substrates. Recently polycrystalline silicon (poly-Si) is being deployed in the fabrication of high resolution liquid-crystal displays. Poly-Si also has the advantage that circuits can be integrated onto the glass substrate as well. Poly-Si also affords the possibility of larger aperture ratios on the pixel, thus increasing the light utilization efficiency and reducing power consumption for the display. For applications requiring large current, a-Si is not suitable and poly-Si has yet to be used.

To achieve the industrialized manufacture of a poly-Si TFT active-matrix display panels, a very high quality of poly-Si film is necessary. It needs to meet the requirements of the low temperature process, can be realized over large-area glass substrate, low manufacture cost, stable manufacture process, high performance, uniform characteristics, and high reliability of poly-Si TFT.

High temperature poly-Si technology can be used to achieve high performance TFT, but it cannot be applied to common glass substrates used in commercial display panels. Low temperature poly-Si (LTPS) must be used in such cases. There are three major LTPS technologies: (1) Solid-phase crystallization (SPC) by annealing at 600° C. for a long time; (2) excimer laser crystallization (ELC) or flash lamp annealing; and (3) metal induced crystallization (MIC) and its related variations. ELC produces the best results but is expensive. SPC is the least costly but takes a long time. None of these technologies can meet all the requirements of low cost and high performance mentioned above.

Common to all polycrystalline thin film materials is that the film's grains are essentially randomly distributed in size, in crystalline orientation and in shape. The grain boundaries are also usually detrimental to the formation of good TFTs. When this polycrystalline thin film is used as the active layer in TFT, the electrical characteristics depend on how many grains and grain boundaries are present in the active channel.

The common problem of all existing technologies is that they form many grains within the TFT active channel in a non-predictable pattern. The distribution of grains is random, making the electrical properties of the TFT somewhat non-uniform across the substrate. This wide distribution of electrical properties is detrimental to the performance of the display and leads to problems such as mura defects and non-uniform brightness.

The grains of a polycrystalline thin film transistor form a random network. This is true for any semiconductor material, such as silicon, germanium, silicon germanium alloy, three five compound semiconductors, as well as organic semiconductors. Conduction inside the grain is nearly the same as crystalline material, while conduction across the grain boundary is poorer and contributes to the overall loss of mobility and increased voltage threshold. Inside the active channel of a thin film transistor (TFT) made of such polycrystalline thin film, the grain structure is nearly a two dimensional random network. The randomness and consequential variable electrical conduction adversely effects display performance and picture quality.

As shown in FIG. 1a of a typical poly-Si structure, the low temperature poly-Si film 101 includes grains 102. There are obvious grain boundaries 103 between neighboring grains 102. Every grain 102 is sized from tens of nanometer to several microns in length and is considered as a single crystal. A lot of defects of dislocation, stack fault and dangling bond are distributed in the grain boundaries 103. Due to different preparation methods, the grains 102 inside of the low temperature poly-Si film 101 may be randomly distributed or in certain orientation.

As to conventional low temperature poly-Si film 101, there are serious defects in grain boundaries 103, as shown in FIG. 1b. The serious defects in grain boundaries 103 will introduce a high barrier potential 104. The barrier potential 104 perpendicular to (or the vertical component of the oblique barrier potential) the direction carrier 105 transportation will affect the initial state and ability of the carrier.

For the thin-film transistor fabricated on this low temperature poly-Si film 101, the threshold voltage and the field effect mobility are limited by the grain boundary barrier potential 104. The grain boundaries 103 distributed in the junction region also cause large leakage current when a high reverse gate voltage is applied in the TFT.

An effective way to improve the grain boundaries 103 (i.e. to reduce the grain boundary barrier potential 104) is to perform another post annealing on the low temperature poly-Si at 900° C.-1100° C. (refer to U.S. Pat. No. 6,225,197 and JP Patent 2001244198), or irradiate the poly-Si 101 by excimer laser or flash lamp (refer to US Publication 2005040402 and JP Patent 2004179195). After the post annealing or irradiation, the low temperature poly-Si film 101 is transformed into the post annealed poly-Si films 201, as shown in FIG. 2a.

FIG. 2a is a schematic diagram of an annealed ELC low temperature poly-Si film 201 and corresponding barrier potential distribution as shown in FIG. 1b. Normally, the inside of grain 202 is basically the same as the original grain 102. Post annealing or irradiation can significantly ameliorate the grain boundaries 203. At the same time the grain boundary barrier potential 204 shown in FIG. 2b is considerably reduced. The mobility of carrier 205 is also greatly improved.

Applying the post annealed or irradiated poly-Si 201 film as the active layer of a TFT considerably improves the field-effect mobility and decreases the threshold voltage and the leakage current of the TFT over the conventional poly-Si TFT. However, there are still some limits to this technique. The temperature of the post annealing is around 900° C.-1100° C., which can not be applied to the common glass substrate used in a commercial display panel. Only quartz or some other high temperature-resistant material can be used as the substrate, which limits the size of the display and the cost of the panel.

If the low temperature poly-Si film 101 is post annealed with an excimer laser or a flash lamp, good mobility can be obtained. But this method is performed at a high cost. Moreover, it is well known that excimer laser annealing leads to non-uniform thin films due to laser beam non-uniformity. Furthermore, post annealing of the LTPS is more complicated than direct annealing of a-Si.

Another effective way to decrease the impact of the grain boundaries 103 (i.e. the grain boundary barrier potential 104) is to implant the intrinsic LIPS with low dose impurity, and adjusted it to a light p type or n type poly-Si as shown in FIG. 3a. This method is disclosed in "High-Performance Poly-Si TFTs With Multiple Selectively Doped Regions In The Active Layer" (Min-Cheol Lee, Juhn-Suk Yoo, Kee-Chan Park, Sang-Noon Jung, Min-Koo Han, and Hyun-Jae Kim, "High-Performance Poly-Si TFTs With Multiple Selectively Doped Regions In The Active Layer" 2000 Materials Research Society) and "A Novel Poly-Si TFTs with Selectively Doped Regions Fabricated by New Excimer Laser Annealing" (M. C. Lee, J. H. Jeon, I. H. Song, K. C. Park and M. K. Han, "A Novel Poly-Si TFTs with Selectively Doped Regions Fabricated by New Excimer Laser Annealing", SID 01 Digest. p. 1246-1249).

Figure 3:
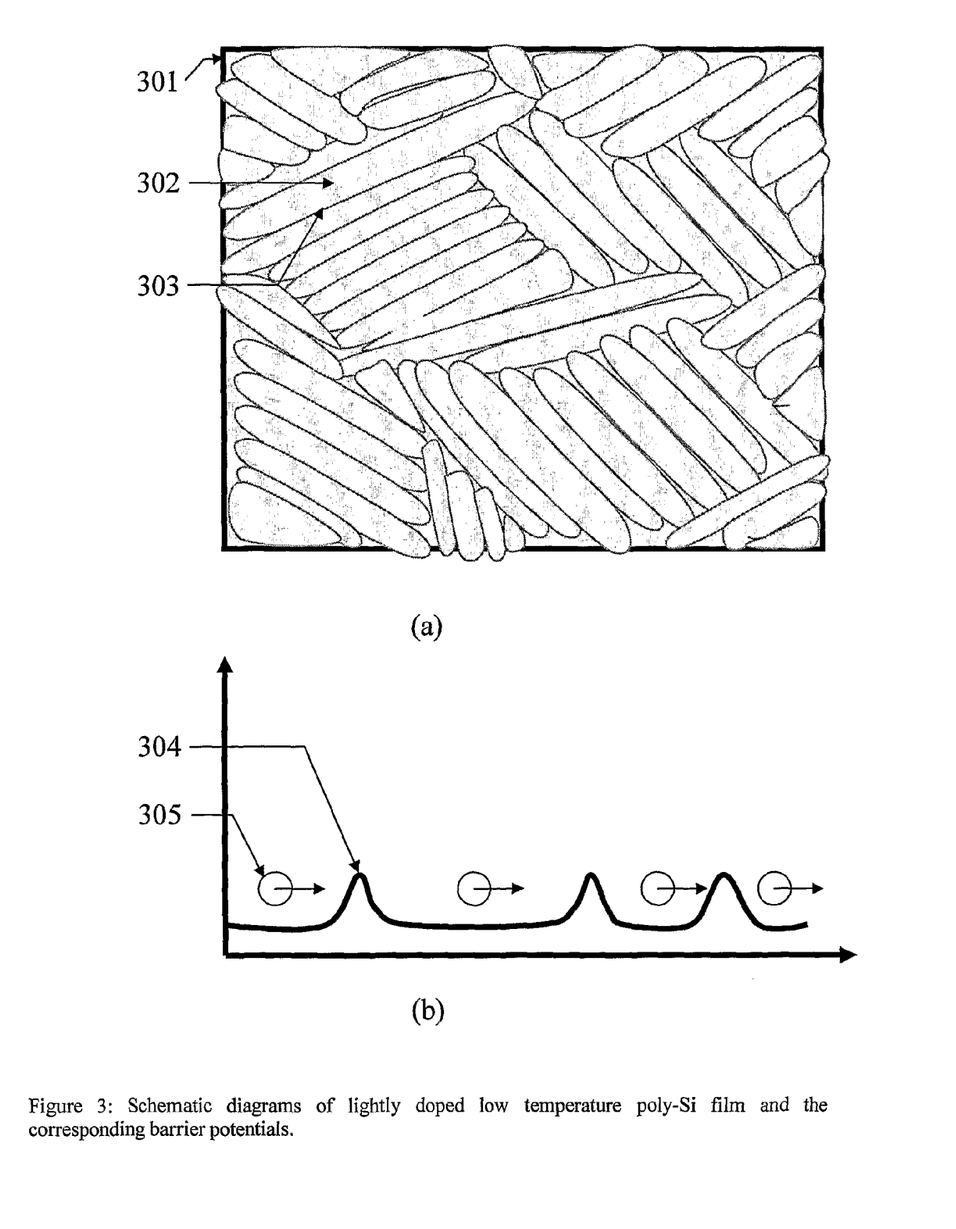
FIG. 3a is a schematic diagram of lightly doped low temperature poly-Si film.
FIG. 3b is a graph of the FIG. 3a corresponding barrier potentials.

The low temperature poly-Si film 301 contains distributed grains 302. The grain boundary 303 still possesses a higher grain boundary barrier potential 304 as shown in FIG. 3, though it is considerably reduced because of lightly doping the low temperature poly-Si film 301. The mobility of carrier 305 is also greatly improved because of the reduced barrier potential 304.

The observed reduction is achieved by light dosage ion implantation lowering the grain boundary potential 304 by implanting impurities into the grains 302. For example, if the ions $B^+$ at dose of $5\times10^{12}$ atoms/cm$^2$ are implanted into the low temperature poly-Si 101, the threshold voltage can be lowered by several volts. However, with the increasing of the doping dose, the leakage current will increase. Implantation can adjust the threshold voltage in a certain range, but it contributes little to the field effect mobility and to the reduction of the leakage current. Thus, it is only a partial solution.

Furnace annealing is a commonly used method for obtaining low temperature poly-Si below 600° C. It is applied in the case of solid phase crystallization (SPC) or metal induced crystallization (MIC). However, SPC and MIC cannot achieve TFT with a high performance as those obtained with ELA post annealing or high temperature post annealed poly-Si. In the present technique, we make use of furnace annealing of low temperature poly-Si to achieve TFT with high performance, high uniformity, and high stability. The quality of this type of LTPS TFT can be as good as the LTPS TFT obtained by high temperature annealing or ELA annealing. The new technique can also be applied to ELA or flash lamp annealed TFT to improve its uniformity as well.

The grains of a polycrystalline thin film transistor form a random network in conventional TFTs made from any semiconductor material, such as silicon, germanium, silicon germanium alloy, three five compound semiconductors, as well as organic semiconductors. Conduction across grain boundaries is poorer than within the crystalline material and contributes to the overall loss of mobility and increased voltage threshold. Inside the active channel of a thin film transistor (TFT) made of such polycrystalline thin film, the grain structure is nearly a two dimensional random network.

In the present invention, we disclose a method to improve the properties of TFT made with all of the above techniques. Important properties such as threshold voltage, on-off ratio, device mobility, device uniformity across the substrate and sub-threshold slope, can all be improved using the present invention. The improvement can be achieved at low cost, thus making inexpensive, high performance LTPS TFT a reality.

SUMMARY

The present application discloses methods and systems to fabricate and form poly-Si TFT films incorporating latitudinal conductive bands ("bridges") to enhance current flow through the poly-Si film across the grain structures formed in the TFT active channel. These bridges not only make the current density more equal across the width of the channel, but also provide connections from grain to grain which allows current to bypass the grain boundaries.

The disclosed innovations, in various embodiments provide one or more of at least the following advantages:

Improved electrical performance.
Improved field effect mobility.
Improved uniformity of the current-on flow.
Reduced costs.
Reduced threshold voltage and leakage current.
Reduced randomness of grain mobility and grain boundary resistance.
Decreased barrier potential and improved carrier mobility in the "on" state.
Reduced leakage current in the "off" state.

BRIEF DESCRIPTION OF THE DRAWINGS

The disclosed innovations will be described with reference to the accompanying drawings, which show important sample embodiments of the invention and which are incorporated in the specification hereof by reference.

DETAILED DESCRIPTION OF THE PREFERRED EMBODIMENTS

The numerous innovative teachings of the present application will be described with particular reference to the presently preferred embodiment (by way of example, and not of limitation).

Figure 1:
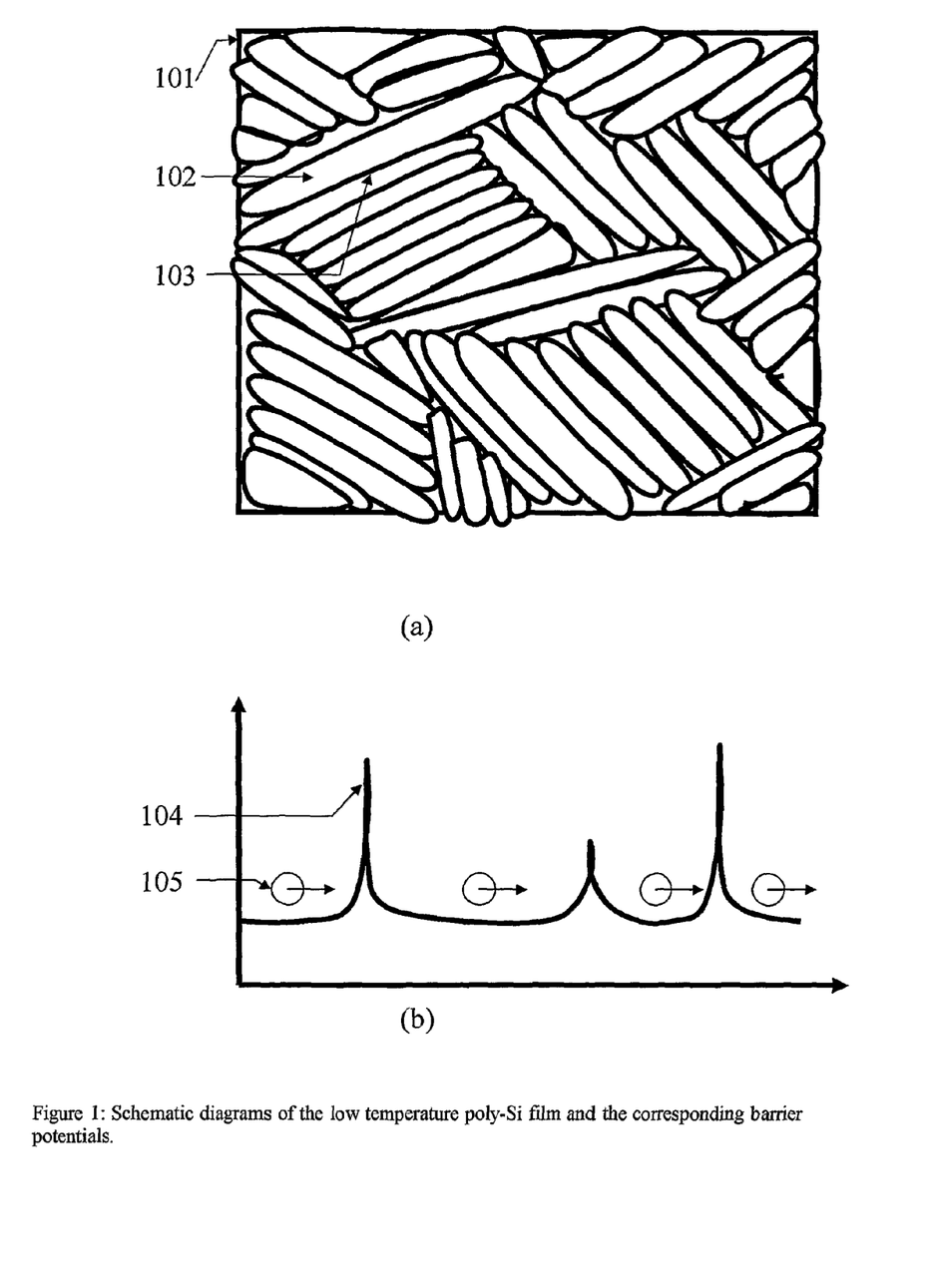
FIG. 1a is a schematic diagram of the low temperature poly-Si film.
FIG. 1b is a graph of the FIG. 1a corresponding barrier potentials.
Figure 2:
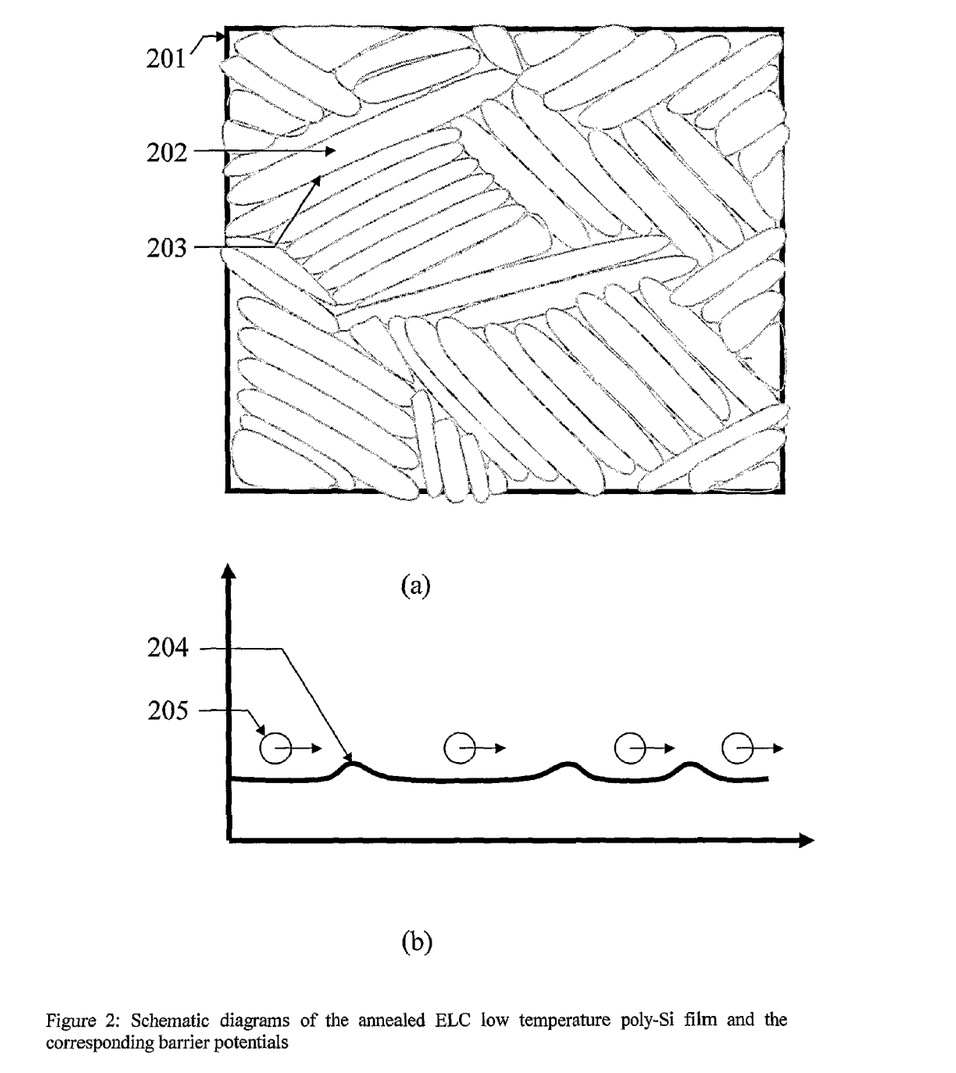
FIG. 2a is the schematic diagrams of the annealed ELC low temperature poly-Si film.
FIG. 2b is a graph of the FIG. 2a corresponding barrier potentials.
Figure 4:
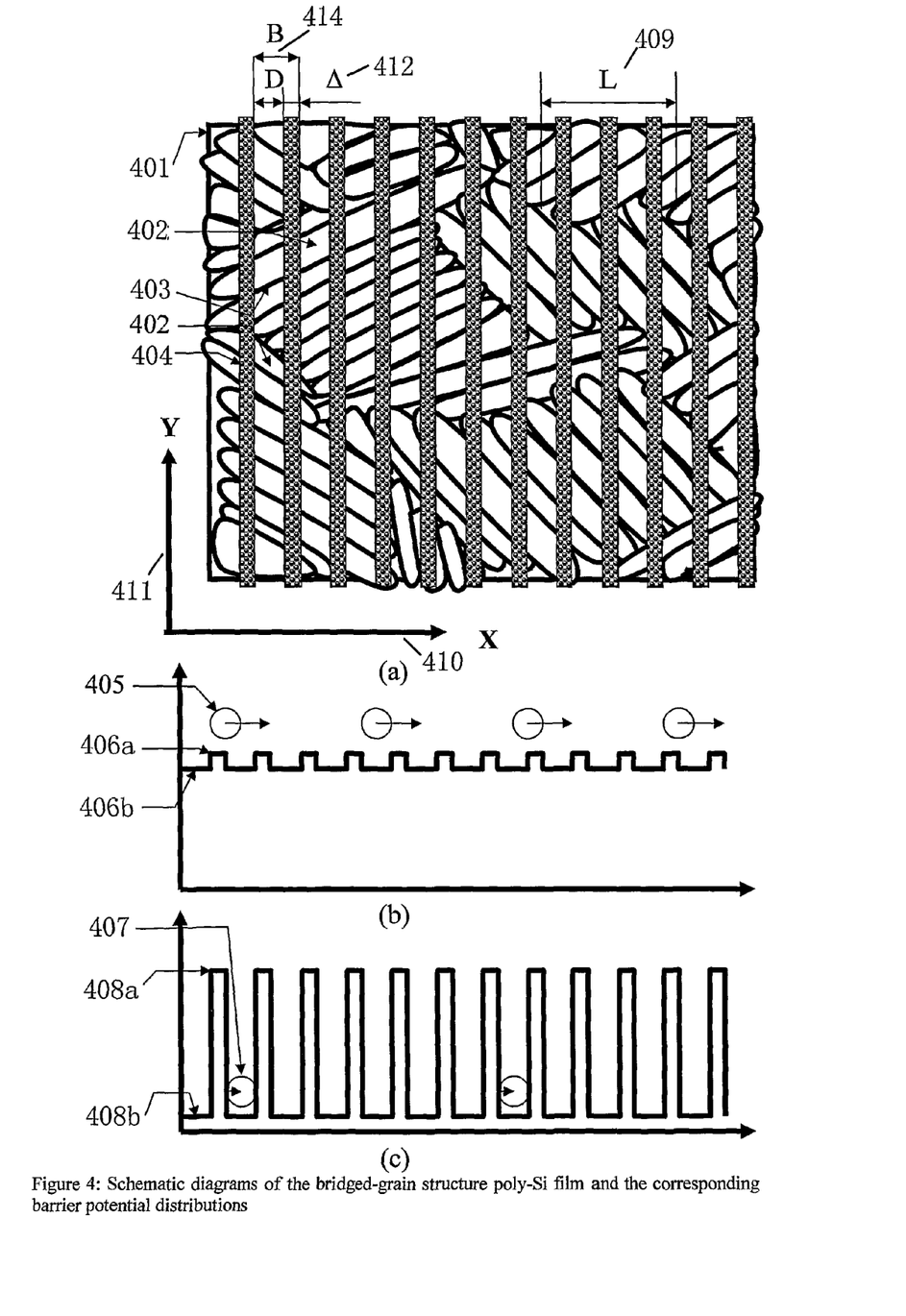
FIG. 4a is schematic diagrams of the bridged-grain structure poly-Si film.
FIGS. 4b and 4c are graphs of the FIG. 4a corresponding barrier potential distributions.

One of the disclosed inventions is bridging of the grains inside the active channel of the TFT using conductive bands or lines. The grains are randomly distributed inside the channel as shown in FIGS. 1-3. By forming conductive bands or lines across the grains in a direction moving toward perpendicular across the current flow, the performance of the TFT can be greatly improved. Essentially the 2D network is turned into a pseudo 1D network. Referring briefly to FIG. 4a, the conductive lines allow easy current flow in the perpendicular direction to the current flow. The effects of the grain boundaries are reduced by these conductive lines, which can be regarded as bridges across the grains. This structure is defined as a bridged-grain (BG) structure. However, other names can be used as well, such as zebra doping, line doping, and delta doping structures.

The bridged-grain structure reduces the effect of the grains by using conductive lines across the grain boundaries. These lines or bridges are formed by doping the channel in a crosswise manner as shown by FIG. 4a. These bridges are free standing and not connected to the source and drain. It should also be noted that the doping can be of both polarities, so both n and p-type dopants can be used. The spacing between the lines needs to be small enough. The spacing should be smaller than the grain size in order to bridge the grains effectively. Larger spacing can be used as well, with less effect. Other benefits arise from forming the conductive channels by doping, such as reducing the leakage current, enhancing the on-current in an active channel, or composing a gate from many p-n junctions in series. For example, if the TFT is an n-channel TFT, the source drains are n+ doped. If the bridges or conductive lines are also n-doped, then the gate will form a series of p-n junction for the case of zero or negative gate voltage. The leakage current will surely be less than the case of a single p-n junction, as in the case of conventional TFT.

The teachings of the invention include doping the poly-Si active channel with crosswise patterns as shown in FIG. 4a. The dopant should have the same polarity as the induced channel inversion layer. The grains within the channel are bridged in the direction perpendicular to the current flow. The crosswise doped regions can have widths of a few nanometers to hundreds of nanometers. The on-current is larger than the case of conventional TFT since the effective channel is shorter. When no gate voltage is applied, the source drain bias will essentially see many p-n junctions, instead of just one p-n junction as in conventional TFT. Thus, the leakage current is greatly reduced.

Uniformity of the on-current is also greatly improved since the channel between the crosswise doped regions is short and contains fewer numbers of grains than a conventional TFT. Thus, the randomness of grain mobility and grain boundary resistance is reduced, leading to better uniformity of electrical properties for the TFT.

The doping of the poly-Si active channel can be achieved by ion implantation. It is the same as ion implantation of the source and drain. The crosswise doping regions compose of nanometer wide lines. These lines do not touch each other and are not in contact with any other electrodes. They are floating, and their only function is to bridge the grains in the direction of current flow. This bridging essentially lowers the resistance of the grain boundaries, reducing their effectiveness. The grains in the direction covered by the bridge can be considered shorted electrically.

In some embodiments (but not necessarily all), the disclosed ideas are used to bridge the grain structures using conductive lines or bands arranged perpendicular to the direction of current flow.

In a first preferred embodiment, a bridged-grain polycrystalline thin film is first formed. This bridged-grain thin film is formed by creating many conductive lines on a polycrystalline thin film. The starting polycrystalline thin films can be formed by many methods as well. For example, they can be formed by solid state crystallization (SPC), by excimer laser crystallization (ELC), or by metal induced crystallization (MIC) of an amorphous thin film.

The conductive lines formed on the polycrystalline thin film should be narrow and very close to each other. The line width and the spacing should be comparable to the size of the crystalline grains. The conductive lines should not touch each other and should cover the entire polycrystalline thin film for later processing. It is acceptable to have these lines broken and not continuous, and the term line as used herein includes both broken and continuous. The conductive lines' main function is to bridge the grains in the direction perpendicular to the direction of current flow. Thus current flow along these lines is not an important issue.

FIG. 4a shows a schematic diagram of the bridged-grain structure poly-Si film. The conductive lines 404 run perpendicular to the current low. These conductive lines can be formed by doping of the semiconductor with either p or n-type dopants. The dosage can be adjusted to the correct amount to create conductive channels but will generally fall between the range of $10^{12}/cm^2$ to $10^{16}/cm^2$. The doping can be carried out by a variety of methods, such as simple photolithography using a mask, or by photolithography using two laser beams interfering with each other optically, or by direct writing using a focused ion beam.

In the case of direct photolithography, it is necessary to have a mask with a submicron resolution. A better way is to use the optical interference effect of two laser beams to expose the photoresist in photolithography. Large area exposure is possible without the use of a mask. This technique is similar to the fabrication of holograms.

Yet another way is to use a focused ion beam to scan the surface of the thin film. The ion beam is the dopant to make the conductive lines. The ion beam implants the polycrystalline thin film directly. Raster scanning of the thin film can be done readily. This line-by-line scanning is a common technique in cathode ray tubes. It is estimated that the scanning of 0.5 micron lines with 0.5 micron spacing can be done within 15 seconds for a 500×600 mm piece of thin film. This size is common in TFT production on glass substrates. Thus, ion beam scanning is a practical method in addition to laser interference photolithography. Basically, it is quite practical to produce such bridged-grain polycrystalline thin films. Such bridged-grain films will be referred to as BG thin film.

However, it needs to be noted that the name of bridged-grain is just for ease of referring to such films. It can be called other names as well, such as zebra line thin film, or segmented thin films, as well as others.

TFT fabricated using such a bridged-grain polycrystalline thin film as the active layer will be called bridged-grain TFT or BG-TFT. The TFT fabrication process can be standard top gate or inverted gate or any other TFT formation process. All is required is that the bridged-grain polycrystalline thin film is used as the active layer in such TFT. Also the conductive lines should be substantially perpendicular to the direction of current flow. Such bridged-grain TFT or BG-TFT will have better electrical performance than TFT without the bridged-grain structure. Again BG-TFT is only a convenient name being used here to refer to such TFT. It can be called other names such as zebra-line TFT, segmented gate TFT, multiple-p-n-junction TFT, as well as others.

For inverted gate TFT, it is necessary to form the gate first before depositing the active layer. As long as the active layer is the bridged-grain polycrystalline thin film, improvement in electrical properties can be achieved. The BG polycrystalline thin film can be formed in the same manner described above.

In a second and preferred embodiment, the formation of the bridged-grain structure is incorporated as part of the TFT fabrication process. As such it is not necessary to convert the entire polycrystalline thin film into bridged-grain thin film. It is only necessary to convert the active channel, which can be very small, to the BG structure. Thus, the conductive lines can be formed by simple photolithography as part of the TFT fabrication process. This embodiment offers the advantage of simple fabrication in some cases.

FIG. 4a shows a schematic diagram of the bridged-grain structure poly-Si film and discloses the key techniques of the present embodiment. The basic material is low temperature polycrystalline silicon 401 (e.g. germanium silicon or other semiconductor material). This low temperature poly-Si can be MIC low temperature poly-Si, SPC low temperature poly-Si, RTA low temperature poly-Si, directly deposited low temperature poly-Si, ELC poly-Si, and flash lamp crystallization or annealing poly-Si. Due to different preparation methods, the grains 402 inside of the low temperature poly-Si film 401 may be randomly distributed or in certain orientation. Assume the average grain 402 size is L 409. For the club-shaped grain, the current flow is along X-axis 410. Also define the average length of the club-shaped grain as L 409, which ranges from tens of nanometer to several microns.

The conductive lines are substantially perpendicular to the direction of current flow and are in the Y-direction 411. The conductive lines 404 can also be described as crosswise doped region. This is because the best way to produce the conductive channel is by doping. It is also crosswise to the direction of current flow.

The crosswise doped region 404 in width of $\Delta$412 is along Y-axis 411. Between the neighboring crosswise doped region 404 is the intrinsic poly-Si region 401 with a width of D 413. The basic unit is composed of a crosswise doped region 404 and an intrinsic poly-Si region 401. The repeatedly distributed basic unit 414 composes a continuous low temperature poly-Si film in a bridged-grain structure that effectively decreases the adverse effects of the grains 402 and associated grain boundaries 403.

The width of the intrinsic poly-Si region D 413 is smaller than half of the average grain 402 size L 409, which ranges usually from 100 nm to 1000 nm. The width of the doped poly-Si $\Delta$412 should be as small as possible, for example from 30 nm to 500 nm. The width of the basic unit B 414 is from 30 nm-1500 nm.

Among two of the doped poly-Si region is intrinsic poly-Si line containing grains 402 in width of D 413. Most of the grains 402 are cut into small part grains. There are not any intact grains 402 fully surrounded by grain boundaries 403. Almost of the grain segments are connected by the crosswise doping regions. So the intrinsic poly-Si region grains 402 turns into a mass of parallel connected single crystals or grains 402.

FIG. 4a shows the barrier potential distribution of the new material. In the first case, the crosswise doped region 404 and the intrinsic poly-Si region with grains 402, after applying an electric field, are both n-type or both p-type. For example, the boron ($B^+$) doped poly-Si region 404 is p-type, at the same time, the intrinsic poly-Si region with grains 402 is also p-type after applying a voltage on gate electrode. Or, the p+ doped poly-Si region 404 is n-type, and the intrinsic poly-Si region with grains 402 is also n-type after applying a voltage on gate electrode.

Under the above two conditions, the barrier potential is as shown in FIGS. 4b and 4c. In the first case, for the carrier 405, the channel 406b is almost flat. The low barrier potential 406a lowers the threshold voltage. The threshold voltage and the field effect mobility of the TFT are basically determined by the inside structure of the grain. So, the much higher field effect mobility and lower threshold voltage 404b can be achieved.

In the other case, the crosswise doping region 404 and the intrinsic poly-Si region 402 after applying an electric field are different type. For example, the $B^+$ doped poly-Si line 404 is p-type, at the same time, the intrinsic poly-Si region 402 is n-type after applying a voltage on gate electrode. Or, the p+ doped poly-Si line 404 is n-type, but the intrinsic poly-Si region 402 is p-type after applying a voltage on gate electrode. Under the above two conditions, the barrier potential is as shown in FIG. 4c. The high barrier potential 408a caused by inverse PN junctions in series will resist the carrier 407 flowing causing the channel to channel 408c to spike due to the high barrier potential 408a. So the reverse leakage current of the TFT can be considerably decreased.

On account of dual merits mentioned above, the resulting LTPS TFT has higher field effect mobility, a lower threshold voltage and a lower leakage current than the conventional LTPS TFT with the same physical dimension. Furthermore, the uniformity and reliability of TFT can also be improved.

FIGS. 5 to 10 are cross-sectional views illustrating a fabrication process for making a TFT using the bridged-grain structure low temperature poly-Si as the active layer.

Figure 5:
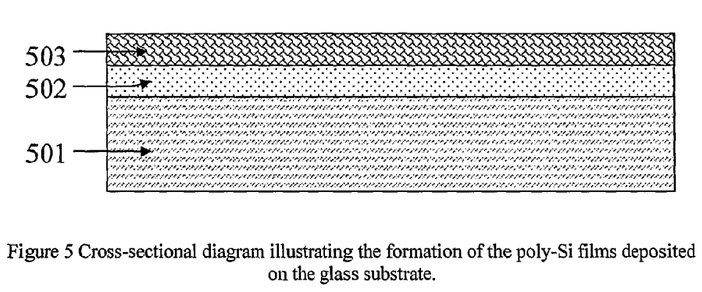
FIG. 5 is a cross-sectional diagram illustrating the formation of the poly-Si films deposited on the glass substrate.
Figure 6:
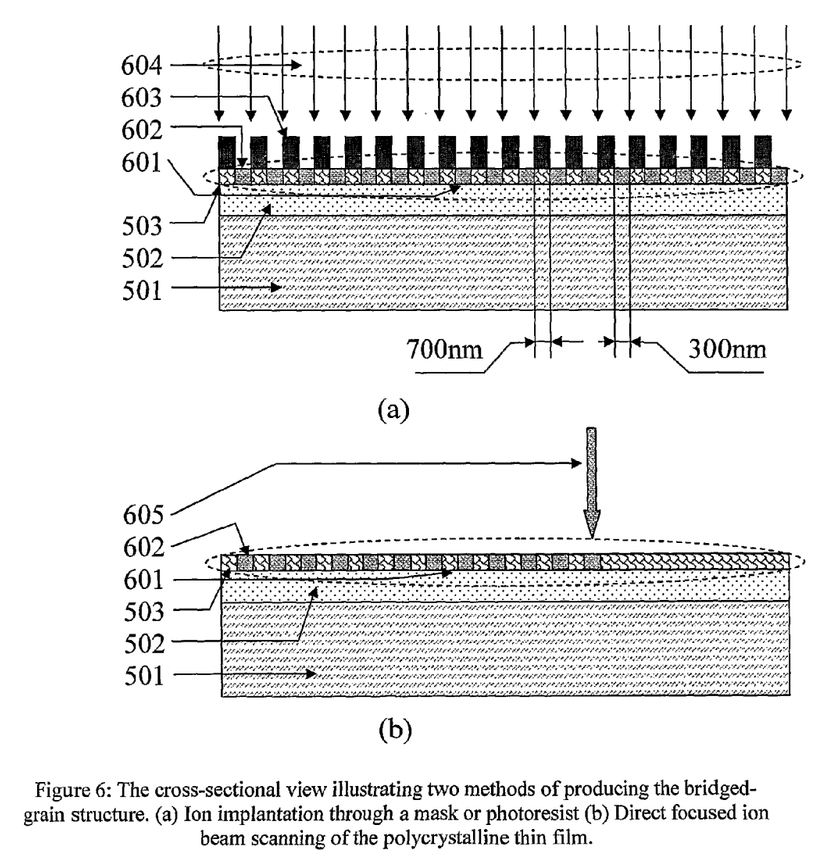
FIG. 6a is a cross-sectional view illustrating one method of producing the bridged-grain structure using ion implantation through a mask or photoresist.
FIG. 6b is a cross-sectional view illustrating one method of producing the bridged-grain structure using direct focused ion beam scanning of the polycrystalline thin film.

FIG. 5 is a cross-sectional diagram illustrating the formation of the poly-Si films deposited on the glass substrate. First, a 300 nm thick low temperature oxide (LTO) 502 is deposited onto a 0.7 mm thick Eagle 2000 glass substrate 501 to serve as a buffer layer to prevent ions from the substrate. Then a 50 nm thick low temperature MILC poly-Si film 503 is formed over the LTO 502 layer.

FIG. 6a is a cross-sectional view illustrating one method of producing the bridged-grain structure using ion implantation through a mask or photoresist on the coated glass substrate. On the surface of the low temperature poly-Si film 503, the photoresist lines 603 in width of 700 nm and with interval of 300 nm is defined using photolithography. Then the B+ ions 604 at a dose of $4 \times 10^{14}/cm^2$ is implanted into the bare area 601 uncovered by photoresist and this uncovered region will become doped silicon 602. At the same time, the entire poly-Si film 503 becomes serial implanted and intrinsic poly-Si regions, because of the repeated parallel lines, the grating manufacturing technique commonly used in industry for large area may be feasible.

FIG. 6b is a cross-sectional view illustrating one method of producing the bridged-grain structure using direct focused ion beam scanning of the polycrystalline thin film to form the bridged-grain structure poly-Si 601 over large substrate. Employing the high speed focused ion-beam direct writing machine, the boron ion-beam 605 is directly implanted into the low temperature poly-Si 503 to become doped silicon 602 and form the crosswise doping region 602.

Figure 7:
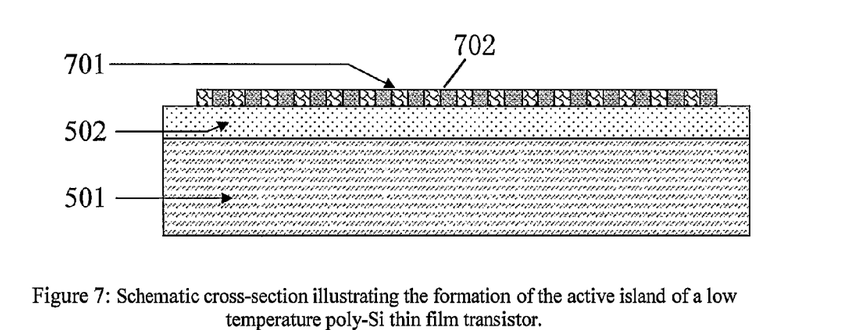
FIG. 7 is a schematic cross-section illustrating the formation of the active island of a low temperature poly-Si thin film transistor.

FIG. 7 is a schematic cross-section illustrating the formation of the active island of a low temperature poly-Si thin film transistor. The bridged-grain structure low temperature poly-Si film 501 is defined to the shape of an active island 701 for a transistor using the photolithography process. The crosswise doping region 701 is perpendicular to the carrier transportation within the active channel and adjacent to the undoped region 702.

Figure 8:
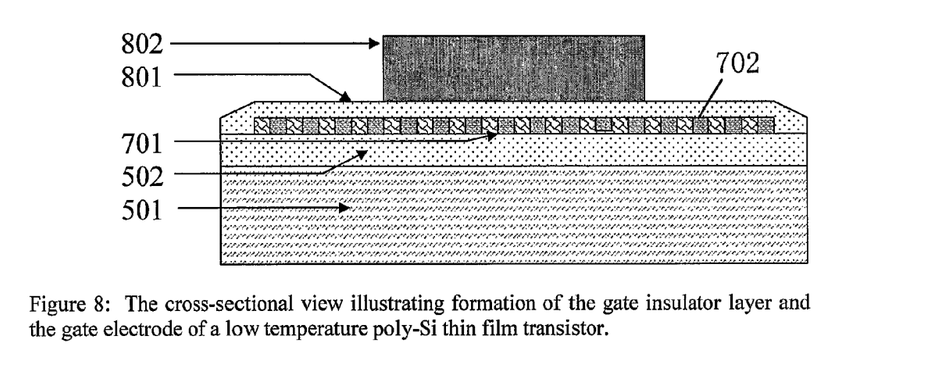
FIG. 8 is a cross-sectional view illustrating formation of the gate insulator layer and the gate electrode of a low temperature poly-Si thin film transistor.

FIG. 8 is a cross-sectional view illustrating formation of the gate insulator layer and the gate electrode of a low temperature poly-Si thin film transistor. The gate insulation layer 801 of 100 nm thick LTO is directly deposited using LPCVD (low pressure chemical vapor deposition) on top of the active island, covering the doped 701 and undoped layers 702. The LTO 502 layer and glass substrate 501 are covered completely by the insulating LTO layer 801. After that, a 300 nm thick Al/Si-1% alloy is deposited and then defined to form the gate electrode 802.

Figure 9:
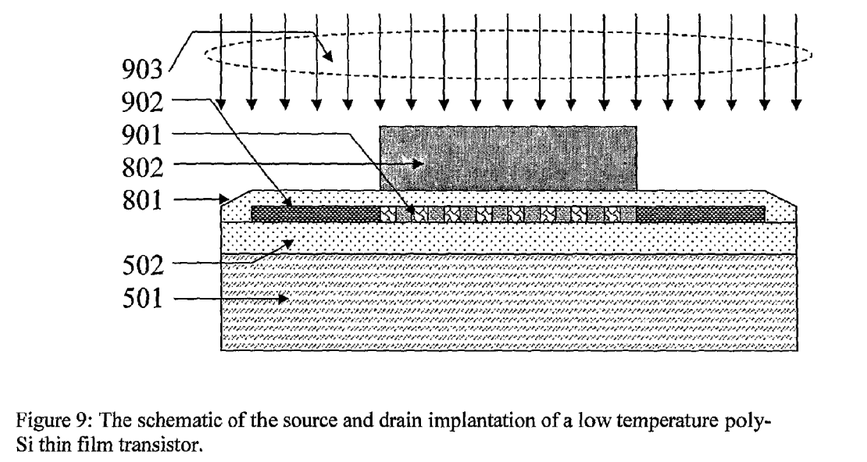
FIG. 9 is a schematic of the source and drain implantation of a low temperature poly-Si thin film transistor.

FIG. 9 is a schematic of the source and drain implantation of a low temperature poly-Si thin film transistor. As shown in FIG. 9, boron ions at the dose of $4\times10^{14}/cm^2$ 903 are implanted to the channel using the gate electrode 802 as an ion stopper. The source and drain 902 is formed. The channel 901 under the gate electrode 802 is undoped.

Figure 10:
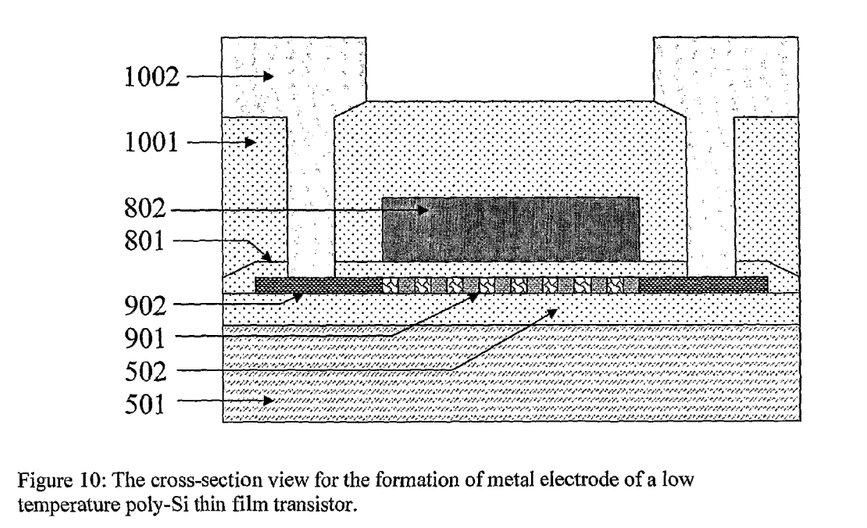
FIG. 10 is the cross-section view for the formation of metal electrode of a low temperature poly-Si thin film transistor.

FIG. 10 is a cross-section view for the formation of metal electrode of a low temperature poly-Si thin film transistor. As shown in FIG. 10, the interlayer insulator 1001 of 500 nm oxide is deposited using PECVD (plasma enhanced chemical vapor deposition). Contact holes are opened before the 700 nm aluminum-1% Si is subsequently sputtered and patterned as source and drain electrode 1002. Contact sintering is then performed by forming gas at 420° C., at the same time the dopants are activated. The fabrication process of a TFT using the bridged-grain structure low temperature poly-Si as active layer has finished.

Figure 11:
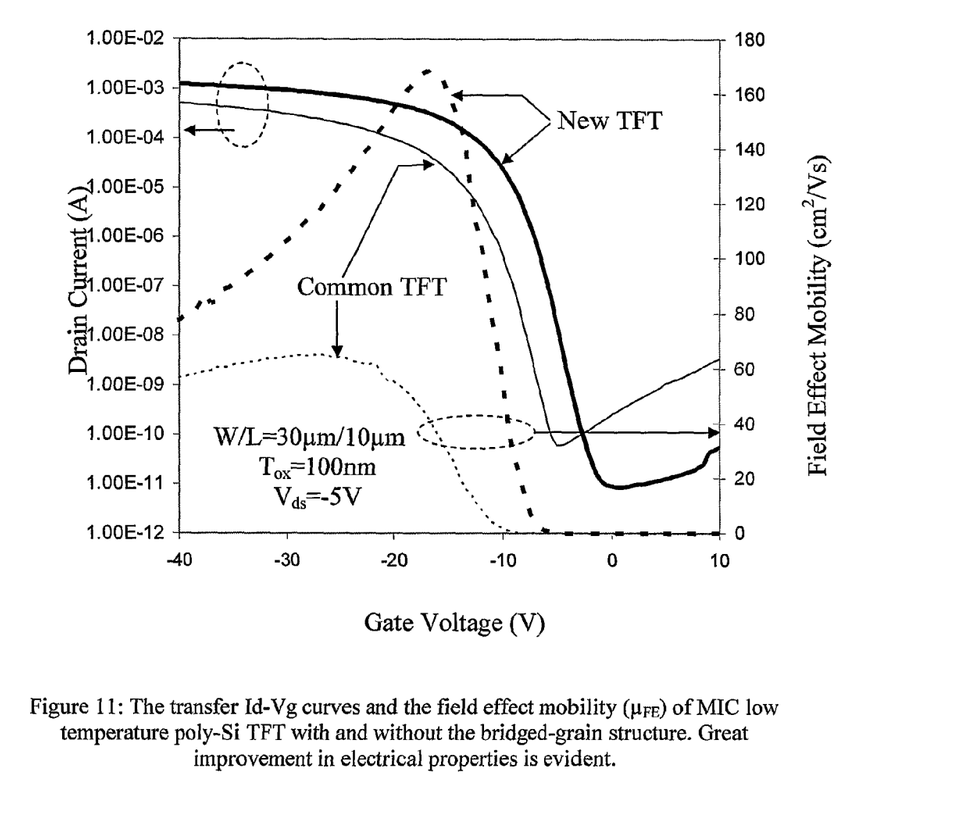
FIG. 11 is the transfer Id-Vg curves and the field effect mobility (pre) of MIC low temperature poly-Si TFT with and without the bridged-grain structure.

FIG. 11 shows experimental data for the case of applying the present invention to MIC low temperature poly-Si TFT. It demonstrates that the electrical performance is significantly improved compared with the conventional MIC low temperature poly-Si TFT. The field effect mobility increases by as much as 2.6 times as the conventional one. The threshold voltage is also lowered by 4V. The leakage current is decreased by two orders of magnitudes. At the same time, the new TFT shows good uniformity and reliability.

Thus low cost, high quality low temperature poly-Si films and thin film transistors can be made. This TFT with the disclosed BG incorporated has important applications to active matrix displays. It can be used in the active matrix flat panel for all kind of displays such as LCD or OLED.

Table 1 shows the electrical characteristics of four types of TFT. MJLC refers to a variation of MIC where the metal is introduced in a smaller region and the polycrystalline film grows laterally. It can be seen that the BG-TFT shows much better performance than TFT without the BG structure. BG-TFT is even better than ELC and high temperature annealed MILC films.

TABLE 1

Comparison of device parameters of low temperature poly-Si TFTs, fabricated using MILC low temperature poly-Si (LT-MILC TFT), bridged-grain structure MILC low temperature poly-Si (BG-MILC TFT), the MILC poly-Si with excimer laser post annealing (ELA-MILC TFT) and the MILC poly-Si with high temperature post annealing (HT-MILC) as active layer respectively.

| | LT-MILC TFT | HT-MILC TFT | ELA-MILC TFT | BG-MILC TFT |
|---|---|---|---|---|
| $\mu_{FE}$ (CM$^2$/Vs) | 65 | 100 | 127 | 168 |
| $V_{th}$ (V) | −10.0 | −6.0 | −4.1 | −5.9 |
| $I_{on}/I_{off}(10^6)$ $V_{ds} = -5$ V | 5.1 | 23.0 | 35.0 | 105.3 |
| $I_{off}$ (pA/μm) ($V_{ds} = -5$ V) ($V_g = 5$ V) | 35.3 | 1.7 | 1.7 | 0.42 |

W/L = 30 pm/10 μm, $T_{ox}$ 100 nm (LTO)

Using this new crosswise doped poly-Si as active layer and making sure the channel is perpendicular to the nano lines, the thin film transistors incorporating this BG structure show outstanding performance. When the TFT works in the "on" state, the implanted poly-Si markedly decreases the barrier potential and improves the carrier mobility. In the "off" state, the reverse p-n junctions in series along the channel greatly reduce the leakage current. Furthermore, since the crosswise doped regions are uniformly and repeatedly distributed, the randomly distributed grain boundary potentials can be rendered more uniform due to the shorting of most grains in the perpendicular direction. Thus the uniformity of the devices built is improved compared to conventional TFTs.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

The above embodiments primarily describe a TFT with a top gate structure using the BG thin film. In a further preferred embodiment, the TFT is of an inverted gate structure using the BG film as the active layer.

Other possible embodiments may feature a BG line that is broken into a non-contiguous manner. These embodiments may appear as checkerboard, broken lines, brick, chevrons, or similar patterns. The BG regions may be positioned across the current flow, but align off a 90° perpendicular angle, such as 80°, 45°, 30°, and the like, just as long as current flow must pass across the BG regions. Further, any semiconductor structure featuring grains may benefit from the invention.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. Moreover, the claims filed with this application are intended to be as comprehensive as possible: EVERY novel and nonobvious disclosed invention is intended to be covered, and NO subject matter is being intentionally abandoned, disclaimed, or dedicated.

While the invention has been particularly shown and described with respect to preferred embodiments, it will be readily understood that minor changes in the details of the invention may be made without departing from the spirit of the invention.

What is claimed is:

1. A transistor, comprising:
a channel layer of a polycrystalline semiconductor material;
first and second source/drain regions which are electrically connected by said channel layer;
a control terminal which electrically interacts with said channel layer, to thereby control conduction between said first and second source/drain regions; and a plurality of crosswise conductive bridges on and in the said channel layer, wherein the plurality of crosswise conductive bridges span an entire width of the said channel layer and spacing between the plurality of crosswise conductive bridges is smaller than about 5 microns.

2. The transistor of claim 1, wherein the crosswise conductive bridges are positioned substantially perpendicular to a desired current flow.

3. The transistor of claim 1, wherein the crosswise conductive bridges are less than 10 microns wide.

4. The transistor of claim 1, wherein the crosswise conductive bridges are formed by doping of the said channel layer.

5. The transistor of claim 1, wherein said semiconductor material is low temperature polycrystalline silicon.

6. The transistor of claim 1, wherein said semiconductor material is temperature polycrystalline silicon material being formed by excimer laser annealing or solid phase crystallization or by metal induced crystallization.

7. The transistor of claim 1, further comprising a glass substrate which supports said semiconductor material.

8. A thin film transistor, comprising:
a source region;
a drain region;
an active channel connecting said source and drain regions, with said active channel having multiple crosswise regions of high resistance and low resistance, wherein the crosswise regions are positioned across the direction of current flow, wherein the multi crosswise regions of low resistance span an entire width of the active channel and spacing between the multiple crosswise regions of low resistance is smaller than about 5 microns; and
a gate which covers a substantial part of the said active channel, including the multiple crosswise regions of high resistance and low resistance, with the said gate being electrically insulated from the said active channel.

9. The thin film transistor of claim 8, wherein the thin film transistor is fabricated using at least one semiconductor material chosen from the group of: silicon; germanium; alloys of silicon and germanium; III-V compound semiconductors; and organic semiconductors.

10. The thin film transistor of claim 8, wherein the thin film transistor is fabricated with at least one of: polycrystalline; microcrystalline; or nanocrystalline materials.

11. The thin film transistor of claim 8, wherein the thin film transistor is fabricated from low temperature polycrystalline silicon material.

12. The thin film transistor of claim 11, wherein the low temperature polycrystalline silicon film is produced by excimer laser crystallization.

13. The thin film transistor of claim 8, wherein the dopants in the crosswise regions form parallel lines, parallel curves, or concentric circles.

14. The thin film transistor of claim 8, wherein the crosswise regions of high resistance and low resistance are in the range of 10 nm to 2500 nm in width.

15. A thin film transistor, comprising:
a source region;
a drain region; and
an active channel connecting the source and drain regions with the active channel having multiple crosswise regions of n and p-type dopants, wherein the regions cross the direction of current flow, and wherein the multiple crosswise regions span an entire width of the active channel and spacing between the multiple crosswise regions is smaller than about 5 microns.

16. The thin film transistor of claim 15, wherein the thin film transistor is fabricated from low temperature polycrystalline silicon material.

17. The thin film transistor of claim 15, wherein the active channel is supported by a glass substrate.

18. The thin film transistor of claim 15, wherein the areal dosage of dopants in said multiple regions is in the range from $10^{12}/cm^2$ to $10^{16}/cm^2$.

19. The thin film transistor of claim 15, wherein the dopants in said multiple regions form parallel lines, parallel curves, or concentric circles.

20. The thin film transistor of claim 15, wherein said active channel is approximately undoped, and said multiple regions are doped with n-type dopants.

21. The thin film transistor of claim 15, wherein said source region is n-type doped, said drain region is n-type doped, said active channel is p-type doped, and said multiple regions are doped with n-type dopants.

22. The thin film transistor of claim 15, wherein said source region is p-type doped, said drain region is p-type doped, and said active channels are n-type doped.

23. A semiconductor electrical element, comprising:
a thin film semiconductor structure containing crystalline grains, separated by grain boundaries, deposited on a non-conducting substrate; and
a plurality of doped regions in the form of lines bridging the grains, the doped regions positioned transversely to current flow, wherein the plurality of doped regions span an entire width of the thin film semiconductor structure and spacing between the plurality of doped regions is smaller than about 5 microns.

24. The semiconductor element of claim 23, wherein said doped region in the form of a line runs continuously across the said semiconductor thin film.

25. A semiconductor structure, comprising:
a polycrystalline semiconductor layer containing crystalline grains separated by grain boundaries; and
a plurality of conductive regions, within said semiconductor structure, which connect grains across said grain boundaries, wherein the plurality of conductive regions span an entire width of the polycrystalline semiconductor layer and spacing between the plurality of conductive regions is smaller than about 5 microns.

26. The structure of claim 25, wherein the doped regions are formed by ion implantation.

27. The structure of claim 25, further comprising at least two current-carrying contacts which are connected to said semiconducting layer, and are separated by said conductive regions, the regions formed by doping a portion of said layer; with the current between the said contacts being controlled by a gate electrode.

28. A method of operating a thin film transistor, comprising the actions of:
controlling the flow of carriers between first and second source/drain regions, through a polycrystalline semiconducting region, using a control terminal; and
equalizing the voltage across the width of the semiconducting region, at multiple points along the length thereof, using conductive zones which are not otherwise connected to said source/drain regions, wherein the conductive zones span the width of the semiconducting region and spacing between the conductive zones is smaller than about 5 microns.

29. The method of claim 28, wherein said equalizing action is accomplished by portions of said semiconducting region which are differently doped than other portions of said semiconducting regions.

30. The method of claim 29, wherein said control terminal is an insulated gate.

31. The method of claim 29, wherein said source/drain, and said semiconducting region are all formed from a common layer of low-temperature polysilicon.

32. A method of operating a thin film transistor, comprising the actions of:
controlling the flow of carriers between source and drain regions, through a polycrystalline semiconducting region which includes grains separated by grain boundaries which include traps, using a control terminal; and
equalizing the current average density across the width of the semiconducting region, at multiple points along the length thereof, using conductive zones which are not otherwise connected to said source nor to said drain, wherein the conductive zones span the width of the semiconducting region and spacing between the conductive zones is smaller than about 5 microns.

33. The method of claim 32, wherein said equalizing action is accomplished by portions of said semiconducting region which are differently doped than other portions of said semiconducting regions.

34. A method of forming a polycrystalline thin film semiconductor, comprising the steps of:
forming a polycrystalline thin film; and
fabricating multiple conductive lines across said film positioned across a desired current flow with the conductive lines substantially parallel to each other and less than 10 micron wide, wherein the multiple conductive lines span an entire width of the polycrystalline thin film and spacing between the multiple conductive lines is smaller than about 5 microns; and
thereafter forming a control terminal which overlies and is insulated from multiple ones of said conductive lines.

35. The method of claim 34, further comprising the step of doping the polycrystalline thin film to form the conductive lines.

36. The method of claim 34, wherein the doping process utilizes photolithography using a mask.

37. The method of claim 34, wherein the doping process utilizes photolithography using optical interference of two coherent laser beams.

38. The method of claim 34, wherein the doping process utilizes raster line-by-line scanning of a focused ion beam.

39. A method of forming thin film transistors, comprising the steps of:
forming a semiconducting thin film on a nonconducting substrate; and
doping one or more crosswise regions in the semiconducting thin film to form alternating lines of high resistance semiconducting thin film and low resistance semiconducting film, wherein spacing between the lines of low resistance is smaller than about 5 microns.

40. The method of claim 39, further comprising the steps of:
employing large area grating manufacturing technique or e-beam direct writing to pattern the semiconducting thin film with the doped crosswise regions to form an active area, with the direction of current flow crossing the crosswise regions;
depositing an insulating layer on the active area to form a gate on top of the active area, with said gate patterned to cover the entire active channel except for the two ends of the channel which are used as the source and drain of the thin film transistor; and
patterning said insulating layer to provide electrical contacts to the source and drain.

41. The method of claim 39, further comprising the step of doping the source and drain region by ions followed by activation of the source and drain.

42. A method of forming thin film transistors, comprising the steps of:
forming a semiconducting thin film on a nonconducting substrate; and
doping one or more crosswise regions in the semiconducting thin film using a large area grating manufacturing technique or an e-beam direct writing machine to pattern the semiconducting thin film with doped crosswise regions to form an active area, current flowing across each of said crosswise regions, wherein spacing between the crosswise regions is smaller than about 5 microns.

43. The method of claim 42, further comprising the steps of:
doping the two ends of the active area to form a source and drain;
depositing an insulating layer on the active area to form a gate on top of the active area to modulate the current flow between the source and drain; and patterning the insulting layer to expose the source and drain in order to make electrical contacts to the source and drain.

44. A method of forming thin film transistors, comprising the steps of:
fabricating an active area of semiconducting materials by photolithography to form a thin-film channel on a nonconducting substrate;
doping plurality of crosswise regions of the active area, to form low resistance regions bordered by high resistance regions, where the direction of current flow is transverse to the crosswise regions, wherein the crosswise regions span an entire width of the active area and spacing between the crosswise regions is smaller than about 5 microns;
depositing an insulating layer on the active area to form an active channel.

45. The method of claim 44, further comprising the step of forming a gate on top of the active area, with said gate patterned to cover the entire active channel except for the two ends of the active channel, which are used as the source and drain of the thin film transistor.

46. A method of forming thin film transistors, comprising the steps of:
fabricating an active area of semiconducting materials by photolithography in the form of a thin-film channel on a nonconducting substrate;
doping the two ends of the active area to form a source and drain; and
doping plurality of crosswise regions of the active area with the same dopants, wherein the crosswise regions are positioned across the direction of primary current flow, and the doping of the source and drain and crosswise regions is performed in the same photolithographic step, wherein the crosswise regions span an entire width of the active area and spacing between the crosswise regions is smaller than about 5 microns; and
fabricating a gate electrode which is insulated from the thin film channel and covers essentially the entire region including the doped regions and the original regions between the source and drain regions.

47. A method of forming thin film transistors, comprising the steps of:
- forming a pattern to make a gate on a nonconducting substrate;
- depositing an insulating layer on the gate;
- forming a semiconducting thin film on the insulating layer; and
- doping plurality of crosswise regions in the semiconducting thin film, wherein the crosswise regions span an entire width of the semiconducting thin film and spacing between the crosswise regions is smaller than about 5 microns.

48. The method of claim 47, further comprising the steps of: patterning the semiconducting thin film with the doped crosswise regions to form an active area with the crosswise regions positioned across the direction of current flow; and doping the two ends of the active area to form a source and drain.

49. A method of forming thin film transistors, comprising the steps of:
- forming and patterning a gate on a nonconducting substrate;
- depositing an insulating layer on the gate; and
- forming a semiconducting thin film on the insulating layer by doping one or more crosswise regions in the semiconducting thin film and
- patterning the semiconducting thin film with the doped crosswise regions to form an active area with the crosswise regions crossing the direction of current flow, wherein the crosswise regions span an entire width of the semiconducting thin film and spacing between the crosswise regions is smaller than about 5 microns.

50. The method of claim 49, further comprising the step of depositing a doped semiconducting layer on the active layer, which is used as the source and drain of the thin film transistor.

51. The method of claim 49, further comprising the step of patterning the doped semiconducting layer as a source and drain of the thin film transistor.

52. A method of forming thin film transistors, comprising the steps of:
- forming and patterning firstly a gate of the thin film transistor on a nonconducting substrate;
- depositing an insulating layer on the gate;
- forming a semiconducting thin film on the insulating layer;
- patterning an active area of semiconducting materials by photolithography to form of a thin-film channel on the insulating layer; and
- doping plurality of crosswise regions of the active area, wherein current flows across the crosswise regions between a source and drain, wherein the crosswise regions span an entire width of the semiconducting thin film and spacing between the crosswise regions is smaller than about 5 microns.

53. The method of claim 52, further comprising the steps of:
- doping the two ends of the active area to form the source and drain; and doping the source and drain and said crosswise regions in the same photolithographic step.

* * * * *

UNITED STATES PATENT AND TRADEMARK OFFICE
CERTIFICATE OF CORRECTION

PATENT NO. : 8,426,865 B2  
APPLICATION NO. : 12/666220  
DATED : April 23, 2013  
INVENTOR(S) : Kwok et al.

Page 1 of 1

It is certified that error appears in the above-identified patent and that said Letters Patent is hereby corrected as shown below:

In the Claims:

Column 11, line 37, "multi" should read -- multiple --.

Column 14, line 58, "doping plurality" should read -- doping a plurality --.

Column 15, line 10, "doping plurality" should read -- doping a plurality --.

Column 16, line 20, "doping plurality" should read -- doping a plurality --.

Signed and Sealed this  
Twentieth Day of August, 2013

Teresa Stanek Rea  
*Acting Director of the United States Patent and Trademark Office*